MULTI-FREQUENCY GENERATOR HAVING FEEDBACK MEANS FOR FREQUENCY STABILIZATION OF OUTPUT SIGNALS
Filed Sept. 1, 1965

Inventor
M. MIYAGI
By Walter J. Baum
Attorney 3,328,717

MULTI-FREQUENCY GENERATOR HAVING FEEDBACK MEANS FOR FREQUENCY STABILIZATION OF OUTPUT SIGNALS

Masahisa Miyagi, Tokyo, Japan, assignor to Nippon Electric Company, Limited, Tokyo, Japan, a corporation of Japan Filed Sept. 1, 1965, Ser. No. 484,418
Claims priority, application Japan, Sept. 3, 1964, 39/50,556
9 Claims. (Cl. 331—2)

Figure 1:
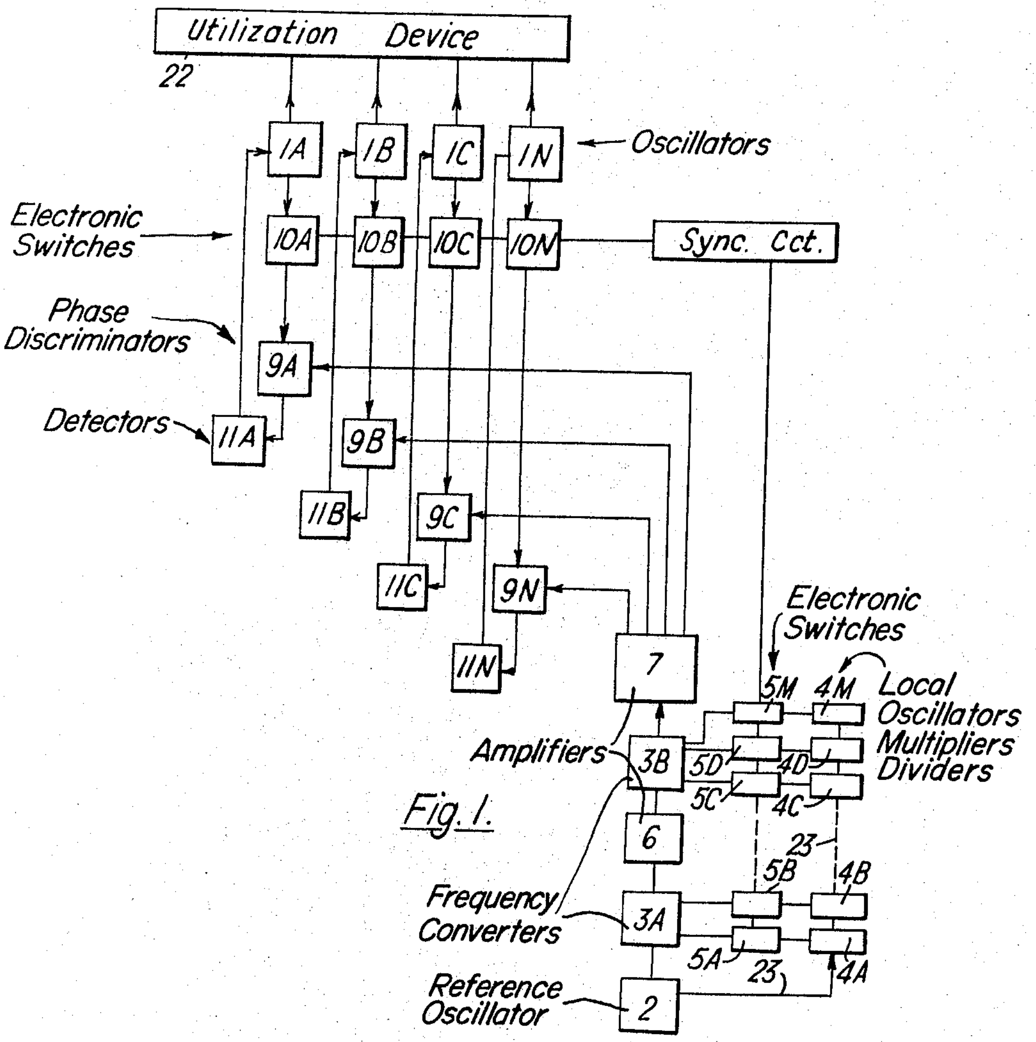

This invention relates to a multifrequency generator which includes a small number of standard oscillators which exhibit good frequency stability for generating continuous oscillations of two or more highly stabilized frequencies.

It is known in the art, that a multiplicity of highly stable continuous oscillations can be generated by means of a device which includes a high-frequency-stabilized oscillator for each frequency to be generated. Such a device, however, is uneconomical particularly when the number of required frequencies is very large. However, there are circumstances where it is necessary to have a large number of continuous oscillations of high frequency stability. Two such applications are for narrow-band microwave transmission and FSK transmission of multiple frequencies. In both these applications highly stabilized frequencies are required since any fluctuation of the frequencies makes it difficult to decrease the band width.

An object of this invention is therefore to provide a frequency-controlled multifrequency generator utilizing a small number of highly stable oscillators for producing a multiplicity of continuous oscillations of highly stabilized frequencies. Such a generator will be useful for the above-mentioned applications, for wireless transmitters etc.

According to the invention, a frequency-controlled multifrequency generator is provided for producing more than one highly stabilized frequency. This generator includes: a standard highly stable oscillator; at least one set of frequency converters; first means for producing oscillations of highly stabilized frequencies or for frequency-multiplying or dividing the output of said standard oscillator. In addition first electronic switch means are provided for applying the respective outputs of said first means to said frequency converters which are also supplied with said output of said standard oscillator; second means are provided for cyclically keying said first electronic switch means to cause said frequency converters to cyclically produce converted-frequency signals. Furthermore, a set of phase discriminators are provided and supplied with the respective outputs of said set of frequency converters; a set of unstable oscillators produce continuous oscillations of a multiplicity of frequencies; and second electronic switch means are also provided. Finally, third means are provided for supplying the respective portions of said continuous oscillations to said frequency converters in timed relation to the application thereto of said converted-frequency signals; detectors are provided for detecting the respective outputs, after being amplified if necessary, of said phase discriminators; and negative feedback means are provided for controlling the frequencies of said unstable oscillators with the respective output signals from said detectors.

Figure 2:
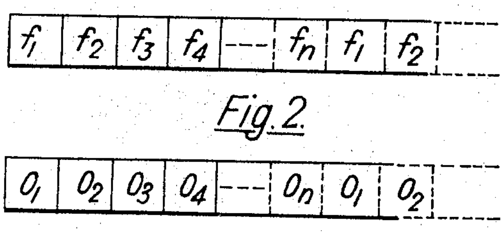

The above-mentioned and other features and objects of this invention and the means for attaining them will become more apparent and the invention itself will be best understood by reference to the following description of embodiments of the invention taken in conjunction with the accompanying drawings in which:

FIG. 1 is a block diagram of an embodiment of the frequency-controlled multifrequency generator of this invention; and FIG. 2 illustrates an example of signals appearing in the embodiment of FIG. 1 of the invention.

Referring to FIG. 1, the frequency-controlled multifrequency generator of this invention includes: a set of oscillators 1A, 1B, 1C, . . . and 1N, which may be self-oscillators or crystal oscillators all having, for example, relatively poor frequency stability. These oscillators produce continuous oscillations. A standard (reference signal) oscillator 2 having high frequency stability is also provided. A frequency converter 3A is supplied with the output (or the frequency-multiplied or divided output) of the standard oscillator 2. Another frequency converter 3B is supplied with the output of the first frequency converter 3A, for example, through amplifier 6. Local oscillators 4A, 4B, 4C, . . . and 4M (which may be separate standard oscillators or frequency multipliers or dividers) are fed with the output (or the frequency-multiplied or divided output) of the standard oscillator 2 through means schematically shown by lead 23. The local oscillators 4A through 4M may be standard oscillator circuits whose operation is synchronized by the local oscillator source 2. As was recited above, the circuits 4A through 4M may alternatively be frequency multipliers or dividers which devices may, in turn, assume a variety of conventional forms.

Electronic switches 5A, 5B, 5C, . . . and 5M are provided for cyclically applying the outputs of the local oscillators 4A, 4B, 4C, . . . and 4M to the associated frequency converters 3A and 3B. It should be understood that one frequency converter is applied at a time with only one local-oscillator ouput and that the number of required standard oscillators will be one or $M+1$ at most. It will also be understood that this arrangement is capable of cyclically producing $M^{C}2$ different converted oscillation frequencies, with a small number of standard oscillators of high frequency stability. The switching may be performed by applying a pulse from synchronizing circuit 25 to that electronic switch 5A–5M which controls the local oscillators 4A–4M of the desired frequency at a given time to make said local oscillator conductive. Amplifiers 6 and 7 amplify the desired single-side-band components of the frequency-converted outputs.

The generator of the invention further includes: phase discriminators 9A, 9B, 9C, . . . and 9N for comparing the respective phase differences between the converted oscillations and the corresponding outputs of the unstable oscillators 1A, 1B, 1C, . . . and 1N. Another set of electronic switches 10A, 10B, 10C, . . . and 10N are provided to supply (in timed relation to the production of the corresponding converted oscillations) portions of the continuous outputs generated by the oscillators 1A, 1B, 1C, . . . and 1N to the phase discriminators 9A, 9B, 9C, . . . and 9N. Switches 10 operate so that each of the continuous oscillations will be supplied to the phase discriminator simultaneously with the converted oscillation with which the continuous oscillation is to be compared. Each phase discriminator produces a discriminator output signal representing the phase difference between the continuous oscillation signal supplied thereto through switches 10 and the corresponding converted oscillation supplied thereto through amplifier 7. The discriminator output signals are detected by detectors 11A, 11B, 11C, . . . and 11N, which includes low-pass filters for filtering said signals. The filtered signals are then used as feedback control signals which are supplied to the respective oscillators 1A, 1B, 1C, . . . and 1N to control the output frequencies of the continuous oscillations which output frequencies are supplied to utilization device 22. Detectors 11A, 11B, 11C, . . . and 11N may be enabled by synchronizing circuit 25 to carry out synchronous detection by the pulses which are used for keying of the electronic switches. Such synchronous detection will permit the continuous oscillation frequencies to be controlled in accordance with the respective phase and frequency deviations of said oscillations.

As will now be obvious, this invention thus makes it possible, using a small number of standard oscillators, to obtain a multiplicity of continuous oscillations which have highly stabilized frequencies. It will now be clear that the continuous oscillations can be controlled by the stable converted oscillations which are arranged in a time-division fashion.

Referring to FIG. 2 wherein the abscissae axes represent time, $f_1$, $f_2$, $f_3$, . . . and $f_4$ illustrate the cyclically extracted portions of the respective unstable oscillators. In FIG. 2 $o_1$, $o_2$, $o_3$, . . . and $o_n$ illustrate the converted oscillations which correspond to the continuous-oscillation portions $f_1$, $f_2$, $f_3$, . . . and $f_n$, respectively.

Recapitulating the operation of the frequency generator of this invention, converted signals are obtained by frequency conversion performed between the output of a standard oscillator 2 and successively and cyclically selected outputs of local oscillators 4A, 4B, 4C, . . . and 4M which local oscillators have a high frequency stability. Each reference oscillation is used for phase comparison with that portion of the continuous oscillations supplied by oscillators 1A–1N which are to be controlled and which is extracted at the time of appearance of the converted oscillation.

More particularly, this application has disclosed a novel frequency controlled multifrequency generator. This multifrequency generator includes at least two unstabilized oscillators (1A–1N). It also includes stabilized signal generating means which comprises a highly stabilized stable frequency reference source (2); and means (4A–4M; and 5A–5M; 3A and 3B) controlled by said source (2) for generating at least one highly stable converted frequency output signal for each unstabilized oscillator (1A–1N). The novel multifrequency generator of this invention further includes comparing means (9A–9N; 10A–10N and 25) for cyclically and synchronously comparing the output from each of said unstabilized oscillators (1A–1N) with a different one of the generated converted output signals. The comparison means generates a signal indicative of the phase difference between each pair of the compared signals. Feedback means responsive to the comparison signal for each pair of compared signals (11A–11N) cyclically feed back a stabilizing signal to that oscillator which generated one of the pair of compared signals for stabilizing said unstable oscillator.

While I have described above the principles of my invention in connection with specific embodiments, it is to be clearly understood that this description is made only by way of example, and not as a limitation to the scope of my invention as set forth in the objects thereof and in the accompanying claims.

What is claimed is:

1. A frequency controlled multifrequency generator comprising: at least two unstable oscillators; stabilized signal generating means including a highly stable frequency reference signal source and means, controlled by said source, for generating at least one highly stable converted frequency output signal for each of said oscillators; comparing means for cyclically comparing the output of each oscillator with a predetermined associated one of said converted outut signals, said compparing means producing a comparison output signal indicative of the phase difference between each pair of compared signals; and feedback means responsive to the comparison signal for each pair of compared signals for cyclically feeding back a stabilizing signal to the associated oscillator, for stabilizing said oscillator whereby the frequency of said unstabilized oscillators will be cyclically stabilized.

2. A frequency controlled multifrequency generator as set forth in claim 1 wherein the stabilized signal generating means includes: frequency converter means connected to said source, and first gating means connected between said first signal generating means and said converter means.

3. A frequency controlled multifrequency generator as set forth in claim 2 wherein said first signal generating means includes a local oscillator controlled by said source, for each of said unstable oscillators.

4. A frequency controlled multifrequency generator as set forth in claim 2 wherein said first signal generator means includes a frequency multiplier controlled by said source, for each of said unstable oscillators.

5. A frequency controlled multifrequency generator as set forth in claim 2 wherein the first signal generating means includes a frequency divider for each of said unstable oscillators.

6. A frequency controlled multifrequency generator as set forth in claim 2 wherein said comparing means includes phase detector means and synchronizing means for cyclically supplying each of the outputs from said oscillators to said phase detector means in synchronism with the predetermined associated one of said converted output signals, said phase detector means producing said comparison output signal indicating the phase and frequency difference between each pair of compared signals.

7. A frequency controlled multifrequency generator as set forth in claim 6 wherein said comparing means includes: a separate phase discriminator for each oscillator; means controlled by said synchronizing means for cyclically supplying a predetermined converted output signal to each of said phase detectors; second gating means, controlled by said synchronizing means for respectively connecting each oscillator to an associated one of said separate phase detectors, said second gating means supplying the output of the oscillator connected thereto to the associated phase discriminator in synchronism with the converted signal supplied to said associated phase discriminator.

8. A frequency controlled multifrequency generator as set forth in claim 7 wherein the feedback means includes a feedback path connected to feed back signals from each phase detector to the associated oscillator, said feedback means cyclically supplying a stabilizing feedback signal to stabilize said associated oscillator.

9. A frequency controlled multifrequency generator as set forth in claim 8 wherein a detector is positioned in each feedback path for detecting the comparison signal produced by the phase discriminator and for producing said stabilizing feedback signal in response to the thus detected comparison signal.

No references cited.

ROY LAKE, *Primary Examiner.*

J. KOMINSKI, *Assistant Examiner.*